(12) United States Patent
Furino, Jr.

(10) Patent No.: US 6,452,452 B1
(45) Date of Patent: Sep. 17, 2002

(54) NEGATIVE FEEDBACK GAIN CONTROL FOR COMMON ELECTRODE TRANSISTOR

(75) Inventor: James P. Furino, Jr., Melbourne Beach, FL (US)

(73) Assignee: Intersil Americas Inc., irvine, CA (US)

( * ) Notice: Subject to any disclaimer, the term of this patent is extended or adjusted under 35 U.S.C. 154(b) by 0 days.

(21) Appl. No.: 09/612,848

(22) Filed: Jul. 10, 2000

(51) Int. Cl.[7] .................................................. H03G 3/10
(52) U.S. Cl. ..................................... 330/278; 330/282
(58) Field of Search .......................... 330/86, 110, 140, 330/278, 282

(56) References Cited

U.S. PATENT DOCUMENTS

| | | | |
|---|---|---|---|
| 3,903,479 A | | 9/1975 | Limberg ...................... 330/22 |
| 3,942,129 A | | 3/1976 | Hall ............................ 330/29 |
| 4,048,576 A | | 9/1977 | Blackburn et al. ............. 330/29 |
| 4,275,362 A | | 6/1981 | Harford ....................... 330/283 |
| 4,305,044 A | | 12/1981 | Leidich ....................... 330/278 |
| 4,365,208 A | | 12/1982 | Harford ....................... 330/278 |
| 4,727,335 A | | 2/1988 | Yokoyama ................... 330/254 |
| 4,774,478 A | * | 9/1988 | Taylor ......................... 330/294 |
| 5,264,806 A | * | 11/1993 | Kobayashi ................... 330/294 |
| 5,389,896 A | * | 2/1995 | Kobayashi ................... 330/282 |
| 5,525,929 A | * | 6/1996 | Nagahori et al. ............. 330/282 |
| 5,661,437 A | * | 8/1997 | Nishikawa et al. .......... 330/282 |
| 5,914,640 A | * | 6/1999 | Nasserbakht ................ 330/294 |
| 6,057,736 A | * | 5/2000 | Kim et al. ................... 330/282 |

* cited by examiner

Primary Examiner—Robert Pascal
Assistant Examiner—Khanh Van Nguyen
(74) Attorney, Agent, or Firm—Alllen, Dyer, Doppelt, Milbrath & Gilchrist, P.A.

(57) ABSTRACT

The unwanted variation in operating point associated with varying the gain of a common input/output electrode transistor, such as a common emitter bipolar transistor, is obviated by coupling an electronically controllable conductance in a negative feedback path between a first input/output electrode (collector) and the control electrode (base) of the transistor. In a first embodiment applied to a bipolar device, the electronically controlled feedback element comprises a diode, having its forward conductance varied by adjusting current flow through a controllable current source. This controls the amount of feedback from the collector to the base and thereby the forward loop gain of the common emitter transistor. In a second embodiment for a bipolar device, the controlled feedback element comprises an emitter-follower transistor, with its forward gain controlled by varying the current drawn through its emitter by a controllable current source/sink. This, in turn, varies the amount of voltage fed back from the collector to the base and thus the gain of the common emitter transistor. Although varying the current drawn by the current source varies the operating point of the feedback element, the bias conditions for the common emitter transistor remain unaffected, so that its operating point and linearity remain constant.

11 Claims, 1 Drawing Sheet

NEGATIVE FEEDBACK GAIN CONTROL FOR COMMON ELECTRODE TRANSISTOR

FIELD OF THE INVENTION

The present invention relates in general to transistor amplifier circuits, such as, but not limited to FET or bipolar transistor amplifier circuits those that may be employed in RF power amplifiers, and is particularly directed to using a negative feedback-based mechanism for electronically controlling the forward loop gain of a common electrode (e.g., emitter or source) transistor without affecting its operating point.

BACKGROUND OF THE INVENTION

Because linearity is a relatively important criterion in the successful operation of RF communication circuits, a common input/output electrode-connected transistor circuit is frequently used as the basic building block of the amplifier architecture. FIG. 1 shows a reduced complexity illustration of a common emitter-configured bipolar transistor Q1 having its base 11 coupled to an input terminal 21 to which a signal to be amplified is applied. The transistor's emitter 12 is coupled to a reference (ground) terminal, and its collector 13 is coupled to an output terminal 22 from which an amplified RF output signal is derived.

In the circuit architecture of FIG. 1, the gain of the amplifier is established by the value of a resistor 23 coupled in a feedback path from the collector 13 to the base 11. In order to vary the gain of the amplifier, it is common practice to intercouple the common emitter transistor Q1 with one or more control circuits, which typically provide some form of bias current modulation or emitter degeneration.

For example, FIG. 2 diagrammatically illustrates a multistage architecture of the type described in the U.S. Patent to Leidich, U.S. Pat. No. 4,305,044, having a common emitter transistor T1 cascaded with a common collector transistor T3. An input signal to be amplified is coupled to the base of the first stage, common emitter transistor T1 via an input terminal 10, while the amplified output signal is derived from an output terminal 16 connected to the emitter of the second stage, common collector transistor T3. A gain control voltage is applied via a terminal 14 to the base of a bias current control transistor T2, the collector of which is connected via node 18 to the collector of a common emitter transistor T1 and the base of the transistor T3. This gain control voltage serves to modulate the conductance (gm) and thereby the collector current of the common emitter amplifier transistor T1.

Other examples of gain controlled common emitter transistor circuit include those disclosed in the U.S. Pat. Nos. 3,903,479; 3,942,129; 4,048,576; 4,275,362; 4,365,208; and 4,727,335. A common shortcoming of these amplifier designs is the fact that the gain of the common electrode (e.g., emitter) transistor stage is varied by changing its operating point. Because the amplifier's linearity is tightly linked to its operating point, changing its gain in this manner undesirably modulates its linearity.

SUMMARY OF THE INVENTION

Pursuant to the present invention, shortcomings of prior art gain control mechanisms for common electrode transistor amplifiers, described above, in particular the unwanted variation in the transistor's operating point, are effectively obviated by a new and improved single stage common electrode transistor amplifier architecture, having an auxiliary electronically controllable conductance installed in a negative feedback path between a first input/output electrode (e.g., collector in the case of a bipolar transistor, drain in the case of a FET) and a control electrode (e.g., base in the case of a bipolar transistor, gate in the case of a FET).

In a first embodiment of the invention applied to a bipolar, common emitter circuit for purposes of providing a non-limiting example, the electronically controlled conductance comprises a diode, whose forward conductance is adjustable by a controllable current source/sink. By varying the amount of current flowing through the controllable current source, the amount of current flowing through diode and thereby its conductance for defining the amount of feedback from the collector to the base and thus the forward loop gain of the common emitter transistor may be varied. Since the bias conditions for the common emitter transistor are unaffected by this control of the conductance of the diode, the operating point of the transistor remains constant, as its gain is controllably varied.

In a second embodiment of the invention (again using a bipolar transistor as a non-limiting example), the electronically controlled conductance comprises a common collector-configured, emitter-follow transistor, having its base coupled to the collector of the common emitter transistor, and its emitter coupled to the base of the common emitter transistor. The gain of the emitter-follower transistor is controlled by coupling its emitter to a controllable current source/sink. varying the amount of current through the controllable current source varies the base-emitter current through the emitter-follower transistor, so that the its voltage follower transfer function, namely the voltage fed back from the collector to the base of the common emitter transistor is varied with the current source current. As in the first embodiment, varying the current source varies the operating point of the feedback device - here, the emitter-follower transistor. However, the bias conditions for the common emitter transistor remain unaffected, so that the operating point and thereby the linearity of the common emitter transistor remain constant, as its gain is controlled. Advantageously, the auxiliary conductance employed in each embodiment has an electronically controlled PN junction device structure of the type contained in the common emitter bipolar transistor circuit, which eliminates the need for an additional mask set in the processing sequence used to fabricate the amplifier circuit.

DETAILED DESCRIPTION

Figure 1:
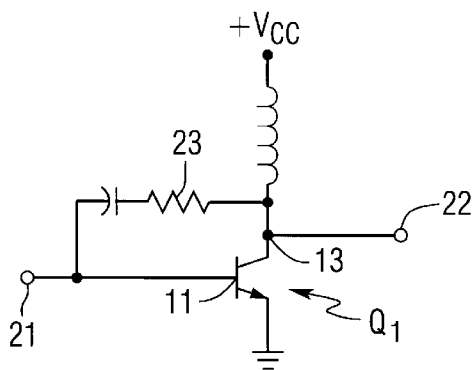
FIG. 1 is a reduced complexity illustration of a common emitter bipolar transistor amplifier circuit.
Figure 2:
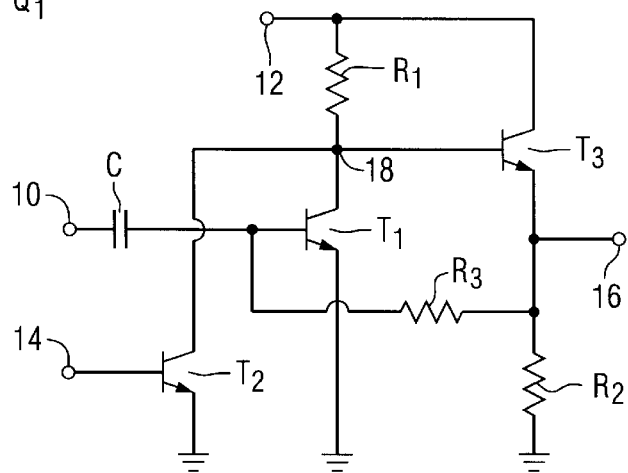
FIG. 2 diagrammatically illustrates a multistage architecture of the type described in the U.S. Patent to Leidich, No. U.S. Pat. No. 4,305,044.
Figure 3:
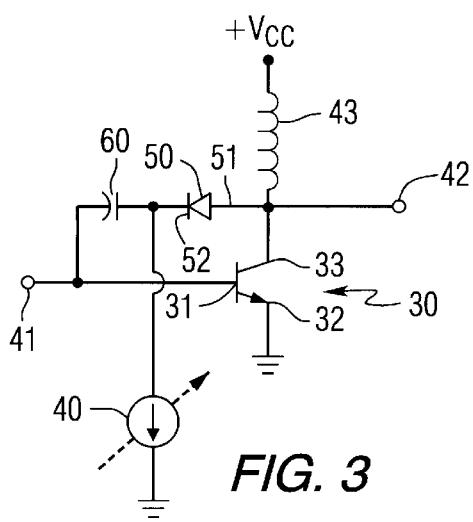
FIG. 3 diagrammatically shows a gain controlled single stage common emitter transistor amplifier in accordance with a first embodiment of the invention.

Attention is now directed to FIG. 3, which diagrammatically shows a gain-controlled single stage common electrode connected transistor amplifier in accordance with a first embodiment of the present invention, as applied to a bipolar (common emitter) transistor, as a non-limiting example. It should be observed that the principles of the present invention are not limited to only a bipolar transistor architecture, as described and shown herein, but may be readily applied to other types of devices, such as, but not limited to field effect transistors (FETs). In addition, the invention is not limited to a particular polarity type, such as NPN or PNP for bipolar devices, or P-channel or N-channel FETs.

In the present example, the common emitter-configured bipolar is an NPN transistor 30 having its base 31 coupled to an input terminal 41 to which a signal to be amplified is applied, its emitter 32 coupled to a source of reference potential (e.g., ground (GND)), and its collector 33 coupled to an output terminal 42, from which an amplified output signal, is derived, and via an inductance 43 to a collector bias terminal (+Vcc). As pointed out above, in accordance with the invention, the forward loop gain of the common emitter transistor 30 is established by controlling a negative feedback path through an electronically controllable conductance between collector 33 and base 31.

In the circuit architecture of FIG. 3, the electronically controlled conductance comprises a diode 50, having its anode 51 coupled to the collector 33 and its cathode 52 coupled through a capacitor 60 to the base 31. The forward conductance of the diode 50 is established by a controllable current source/sink 70 (referenced to ground), that is coupled to cathode 52. By varying the amount of current flowing through the controllable current source 70, the amount of current flowing through diode 50 and thereby its conductance is controllably increased or decreased.

This, in turn, controls the amount of feedback from the collector 33 to the base 31 and thus the gain of the transistor 30. For example, increasing the current drawn by current source 70 will increase the forward conductance through diode 50, and thereby couple more of the signal at the collector 33 of the transistor 30 to its base, thus reducing the gain of the transistor. Conversely, decreasing the current through current source 70 will reduce the forward conductance through diode 50, and thereby couple less of the signal at the collector 33 of the transistor 30 to its base, thus increasing gain. Since the bias conditions for the transistor 30 are unaffected by this control of the conductance of the diode 50, the operating point of the transistor remains constant, as its gain is controllably varied.

Figure 4:
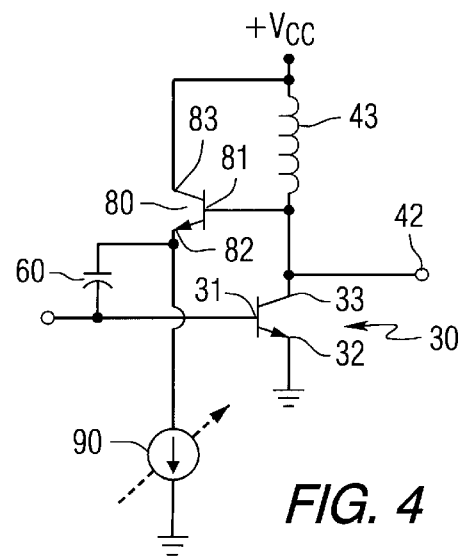
FIG. 4 diagrammatically shows a gain controlled single stage, emitter-follower transistor amplifier in accordance with a second embodiment of the invention.

FIG. 4 diagrammatically illustrates a gain-controlled, single stage, common electrode-connected transistor amplifier in accordance with a second embodiment of the invention, again applied to the case of a bipolar device for purposes of providing a non-limiting example. The circuit of FIG. 4 comprises a common emitter-configured bipolar (e.g., NPN) transistor 30 having its base 31 coupled to input terminal 41 to which a signal to be amplified is applied, its emitter 32 coupled to a source of reference potential (e.g., ground (GND)), and its collector 33 coupled to an output terminal 42, from which an amplified output signal is derived, and via an inductance 43 to a collector bias terminal (+Vcc).

In the second embodiment of the invention, the electronically controllable conductance between the collector 33 and the base 31 of transistor 30 comprises a bipolar (NPN) common collector-configured, emitter-follower transistor 80, having its base 81 coupled to the collector 33 of transistor 30, its collector 83 coupled to the collector bias terminal (+Vcc), and its emitter 82 coupled through a capacitor 60 to the base 31 of transistor 30. The forward gain of the emitter-follower transistor 80 is controlled by coupling its emitter 82 to a controllable current source/sink 90 (referenced to ground).

In the second embodiment, varying the amount of current flowing through the controllable current source 90 varies the base-emitter current through (and thus the operating point of) the emitter-follower transistor 80, so that the amount of voltage fed back from the collector 33 to the base 31 of the common emitter transistor 30 by way of the voltage follower transfer function of the common collector transistor 80 is varied with adjustment of the operation of the current source 90. For example, increasing the current drawn by the current source 90 from the emitter 82 of the emitter-follower transistor 80 will increase the forward conductance through base-emitter junction of the transistor 80 and couple more of the signal at the collector 33 of transistor 30 to its base 31, thereby reducing the forward loop gain of the transistor 30.

Conversely, decreasing the amount of emitter current drawn from the transistor 80 by the current source 90 will reduce the forward conductance through base-emitter junction of the emitter-follower transistor 80, and thereby couple less of the signal at the collector 33 of the common emitter transistor 30 to its base 31, reducing the gain of the common emitter transistor 30. Although varying the amount of current drawn by the current source 90 varies the operating point of the emitter-follower transistor 80, the bias conditions for the transistor 30 remain unaffected, so that the operating point (and thereby the linearity) of the common emitter transistor 30 remains constant, as its gain is controllably varied.

As will be appreciated from the foregoing description, in accordance with the present invention, the unwanted variation in operating point of a common electrode-connected transistor (e.g., common emitter bipolar transistor) associated with varying its gain by means of conventional gain control mechanisms are effectively obviated by coupling an electronically controllable conductance in a negative feedback path between a first input/output electrode (e.g., collector) and the control electrode (e.g., base) of the transistor.

Where the electronically controlled feedback element comprises a diode, its forward conductance is readily varied by adjusting current flow through a controllable current source coupled to the diode. This controls the amount of feedback from the first input/output electrode (collector) to the control electrode (base) and thereby the forward loop gain of the transistor. Where the controlled feedback element comprises an electrode follower transistor, such as emitter-follower bipolar transistor, or a source-follower FET, its forward gain is readily controlled by.,varying the current drawn through its second input/output electrode by a controllable current source/sink. This, in turn, causes the amount of voltage fed back from the first input/output electrode to the control electrode of the transistor to be varied.

Although varying the current drawn by the current source varies the operating point of the electronically controlled feedback element, the bias conditions for the common electrode transistor remain unaffected, so that the operating point and thereby the linearity of the transistor remain constant. As noted above, for the case of a bipolar architecture, since the auxiliary element employed by each embodiment has an electronically controlled PN junction device structure of the type contained in a common emitter bipolar transistor circuit, the auxiliary feedback conductance may be readily formed in same mask set for the processing sequence fabricating the amplifier circuit.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A method for controlling the gain of a transistor having a control electrode, a first input/output electrode and a second input/output electrode, wherein an input signal is applied to said control electrode and an output signal is derived from said first input/output electrode, and said second input/output electrode is coupled to a reference node to realize a common electrode transistor configuration, said method comprising the steps of:

(a) coupling a controllable electronic conductance between the control electrode and first input/output electrode of said common electrode transistor; and (b) controlling the operation of said controllable electronic conductance in such a manner as to adjust the forward loop gain, without varying the operating point, of said common electrode transistor, wherein said controllable electronic conductance includes a rectifying PN junction coupled with the control electrode and first input/output electrode of said common electrode transistor, and a variable current source coupled with said rectifying PN junction and being operative to control the current through and thereby the conductance through said controllably electronic conductance, so as to control the voltage fed back from said first input/output electrode to the control electrode of said common electrode transistor.

2. A method for controlling the gain of a transistor having a control electrode, a first input/output electrode and a second input/output electrode, wherein an input signal is applied to said control electrode and an output signal is derived from said first input/output electrode, and said second input/output electrode is coupled to a reference node to realize a common electrode transistor configuration, said method comprising the steps of:

(a) coupling a controllable electronic conductance between the control electrode and first input/output electrode of said common electrode transistor; and (b) controlling the operation of said controllable electronic conductance in such a manner as to adjust the forward loop gain, without varying the operating point, of said common electrode transistor, wherein said controllable electronic conductance comprises a diode having its forward current conduction path in parallel with that of the control electrode- first input/output electrode path of said common electrode transistor, and a variable current source coupled with said diode and being operative to control the current through and thereby the conductance of said diode, so as to control the voltage fed back from said first input/output electrode to the control electrode of said common electrode transistor.

3. A method for controlling the gain of a transistor having a control electrode, a first input/output electrode and a second input/output electrode, wherein an input signal is applied to said control electrode and an output signal is derived from said first input/output electrode, and said second input/output electrode is coupled to a reference node to realize a common electrode transistor configuration, said method comprising the steps of:

(a) coupling a controllable electronic conductance between the control electrode and first input/output electrode of said common electrode transistor; and (b) controlling the operation of said controllable electronic conductance in such a manner as to adjust the forward loop gain, without varying the operating point, of said common electrode transistor, wherein said common electrode transistor comprises a common emitter bipolar transistor having a base, a collector and an emitter, and wherein said controllable electronic conductance comprises an emitter-follower transistor having its based coupled to the collector of the common emitter transistor, its emitter coupled to the base of the common emitter transistor, and its collector coupled in common collector configuration to a bias source, and a variable current source coupled with the emitter of said emitter-follower transistor and being operative to control the base-emitter current and thereby the voltage follower transfer function thereof, so as to control the voltage fed back from the collector to the base of said common emitter transistor.

4. A circuit comprising:

a common electrode transistor having a control electrode to which an input signal is coupled, a first input/output electrode from which an amplified output signal is derived, and a second input/output electrode coupled to a reference node to realize a common electrode transistor configuration; and a controllable electronic conductance coupled between the control electrode and said first input/output electrode of said common electrode transistor, and being controllably operative to adjust the forward loop gain without varying the operating point of said common electrode transistor, wherein said controllable electronic conductance includes a rectifying PN junction coupled with the control electrode and first input/output electrode of said common electrode transistor, and a variable current source coupled with said rectifying PN junction and being operative to control the current through and thereby the conductance of said controllably electronic conductance, so as to control the voltage fed back from said first input/output electrode to the control electrode of said common electrode transistor.

5. A circuit according to claim 4 wherein said common electrode transistor comprises a common emitter bipolar transistor having a base, a collector and an emitter, and wherein said controllable electronic conductance comprises an emitter-follower transistor having its based coupled to the collector of the common emitter transistor, its emitter coupled to the base of the common emitter transistor, and its collector coupled in common collector configuration to a bias source, and a variable current source coupled with the emitter of said emitter-follower transistor and being operative to control the base-emitter current and thereby the voltage follower transfer function thereof, so as to control the voltage fed back from the collector to the base of said common emitter transistor.

6. A circuit comprising:

a common electrode transistor having a control electrode to which an input signal is coupled, a first input/output electrode from which an amplified output signal is derived, and a second input/output electrode coupled to a reference node to realize a common electrode transistor configuration; and a controllable electronic conductance coupled between the control electrode and said first input/output electrode of said common electrode transistor, and being controllably operative to adjust the forward loop gain without varying the operating point of said common electrode transistor, wherein said controllable electronic conductance comprises a diode having its forward current conduction path in parallel with that of the control electrode-first input/output electrode of said common output electrode transistor, and a variable current source coupled with said diode and being operative to control the current through and thereby the conductance of said diode, so as to control the voltage fed back from the input electrode to said first input/output electrode of said common electrode transistor.

7. A variable gain common input/output electrode transistor circuit comprising:

a common input/output electrode transistor having a control electrode to which an input signal is coupled, a first input/output electrode from which an amplified output signal is derived, and a second input/output electrode coupled to a reference node to realize a common input/output electrode transistor configuration;

a controllable electronic conductance coupled between the control electrode and said first input/output electrode of said common input/output electrode transistor; and a variable current source coupled with said controllable electronic conductance and being operative to control the current through and thereby the conductance of said controllably electronic conductance, so as to control the voltage fed back from said first input/output electrode said control electrode of said common input/output electrode transistor, and thereby adjust the forward loop gain of said common input/output electrode transistor without varying the operating point thereof.

8. A variable gain common input/output electrode transistor circuit according to claim 7, wherein said controllable electronic conductance includes a rectifying PN junction coupled with the control electrode and said first input/output electrode of said common input/output electrode transistor.

9. A variable gain common input/output electrode transistor circuit according to claim 7, wherein said controllable electronic conductance comprises a diode having its forward current conduction path in parallel with that of the control electrode-first input/output electrode path of said common input/output electrode transistor.

10. A variable gain common input/output electrode transistor circuit according to claim 7, wherein said common electrode transistor comprises a common emitter bipolar transistor having a base, a collector and an emitter, and wherein said controllable electronic conductance comprises an emitter-follower transistor having its based coupled to the collector of the common emitter transistor, its emitter coupled to the base of the common emitter transistor, and its collector coupled in common collector configuration to a bias source, and wherein said variable current source is coupled with the emitter of said emitter-follower transistor, and is operative to control the base-emitter current and thereby the voltage follower transfer function thereof, so as to control the voltage fed back from the collector to the base and thereby the gain of said common emitter transistor.

11. A variable gain common input output electrode transistor circuit according to claim 7, wherein said common electrode transistor comprises a common emitter bipolar transistor having a base corresponding to said control electrode, a collector corresponding to said first input/output electrode and an emitter corresponding to said second input/output electrode.

* * * * *